US012641991B2

(12) United States Patent
Zhou et al.

(10) Patent No.: US 12,641,991 B2
(45) Date of Patent: May 26, 2026

(54) DISPLAY PANEL

(71) Applicants: MIANYANG HKC OPTOELECTRONICS TECHNOLOGY CO., LTD., Mianyang (CN); HKC CORPORATION LIMITED, Shenzhen (CN)

(72) Inventors: Ting Zhou, Mianyang (CN); Jing Li, Mianyang (CN); Hailiang Wang, Mianyang (CN); Qi Mu, Mianyang (CN); Laidi Wu, Mianyang (CN); Xiufeng Zhou, Mianyang (CN); Tianjun Huang, Mianyang (CN); Haijiang Yuan, Mianyang (CN)

(73) Assignees: MIANYANG HKC OPTOELECTRONICS TECHNOLOGY CO., LTD., Mianyang (CN); HKC CORPORATION LIMITED, Shenzhen (CN)

( * ) Notice: Subject to any disclaimer, the term of this patent is extended or adjusted under 35 U.S.C. 154(b) by 363 days.

(21) Appl. No.: 18/350,581

(22) Filed: Jul. 11, 2023

(65) Prior Publication Data

US 2024/0315118 A1      Sep. 19, 2024

(30) Foreign Application Priority Data

Mar. 14, 2023    (CN) .......................... 202310244489.6

(51) Int. Cl.
*H10K 59/80*       (2023.01)
*H10K 59/122*      (2023.01)
*H10K 102/10*      (2023.01)

(52) U.S. Cl.
CPC ....... *H10K 59/8792* (2023.02); *H10K 59/122* (2023.02); *H10K 59/80517* (2023.02);
(Continued)

(58) Field of Classification Search
CPC ............. H10K 59/8792; H10K 59/122; H10K 59/80517; H10K 59/878; H10K 2102/102;
(Continued)

(56) References Cited

U.S. PATENT DOCUMENTS

2008/0111125 A1*   5/2008   Kim ...................... H10K 71/60
                                                  438/47
2020/0201088 A1    6/2020   Yao
(Continued)

FOREIGN PATENT DOCUMENTS

CN       104064579       9/2014
CN       107703654       2/2018
(Continued)

OTHER PUBLICATIONS

WIPO, International Search Report for PCT/CN2023/098890, Jul. 21, 2023.
(Continued)

*Primary Examiner* — Donald L Raleigh
(74) *Attorney, Agent, or Firm* — Hodgson Russ LLP

(57)            ABSTRACT

A display panel includes a substrate and a plurality of pixel units arranged in an array on the substrate, each of the plurality of pixel units comprising a plurality of display light-emitting devices. The display panel further comprises an anti-view unit positioned between adjacent display light-emitting devices, and the anti-view unit comprising a reflective layer, an anti-view light-emitting device and an anti-view light-shielding layer sequentially formed on the substrate; wherein an orthographic projection of a light-
(Continued)

emitting layer of the anti-view light-emitting device on the substrate is located within an orthographic projection of the anti-view light-shading layer on the substrate, and the orthographic projection of the light-emitting layer of the anti-view light-emitting device on the substrate overlaps at least partially with the orthographic projection of the reflective layer on the substrate.

18 Claims, 6 Drawing Sheets

(52) U.S. Cl.
CPC ..... *H10K 59/878* (2023.02); *H10K 2102/102* (2023.02); *H10K 2102/103* (2023.02)

(58) Field of Classification Search
CPC ........... H10K 2102/103; H10K 59/126; H10K 59/80518; G09F 9/335
See application file for complete search history.

(56) References Cited

U.S. PATENT DOCUMENTS

| | | | |
|---|---|---|---|
| 2020/0249504 A1 | 8/2020 | Hopkin et al. | |
| 2021/0134903 A1* | 5/2021 | Han | H10K 59/878 |
| 2023/0225169 A1* | 7/2023 | Yan | H10K 59/353 |
| | | | 257/40 |

FOREIGN PATENT DOCUMENTS

| | | |
|---|---|---|
| CN | 109709738 | 5/2019 |
| CN | 109728059 | 5/2019 |
| CN | 110208970 | 9/2019 |
| CN | 111474747 | 7/2020 |
| CN | 112310182 | 2/2021 |
| CN | 212694100 | 3/2021 |
| CN | 112993184 | 6/2021 |
| CN | 114859452 | 8/2022 |
| CN | 114859582 | 8/2022 |
| CN | 217875539 | 11/2022 |
| CN | 115528193 | 12/2022 |
| CN | 116261353 | 6/2023 |
| JP | 2009140205 | 6/2009 |
| KR | 20210043927 | 4/2021 |
| WO | 2019200889 | 10/2019 |
| WO | 2020244289 | 12/2020 |
| WO | 2022099844 | 5/2022 |

OTHER PUBLICATIONS

CNIPA, First Office Action for CN Application No. 202310244489.6, May 11, 2024.
CNIPA, Notification to Grant Patent Right for Invention for CN Application No. 202310244489.6, Jun. 13, 2024.

* cited by examiner

DISPLAY PANEL

CROSS-REFERENCE TO RELATED APPLICATIONS

This application claims priority to Chinese Patent Application No. 202310244489.6, filed Mar. 14, 2023, the entire disclosure of which is incorporated herein by reference.

TECHNICAL FIELD

The present application relates to the technical field of display equipment, more particularly, to a display panel.

BACKGROUND

With the enhancement of users' awareness of security protection, there is a great market demand for anti-view technology of display devices. At present, the anti-view technology can be achieved by arranging anti-view sub-pixels in the display for interfering with the display of normal display pixels in order to achieve anti-view of a display. However, the anti-view sub-pixels arranged in the display will seriously reduce the luminance efficiency of the display.

SUMMARY

The present application is to provide a display panel according to embodiments of the present disclosure. The technical solution is as below:

According to a first aspect of embodiments of the present disclosure, there is provided a display panel, which includes a substrate and a plurality of pixel units arranged in an array on the substrate, each of the plurality of pixel units comprising a plurality of display light-emitting devices, wherein the display panel further comprises an anti-view unit positioned between adjacent display light-emitting devices, and the anti-view unit comprising a reflective layer, an anti-view light-emitting device and an anti-view light-shielding layer sequentially formed on the substrate; and wherein an orthographic projection of a light-emitting layer of the anti-view light-emitting device on the substrate is located within an orthographic projection of the anti-view light-shading layer on the substrate, and the orthographic projection of the light-emitting layer of the anti-view light-emitting device on the substrate overlaps at least partially with the orthographic projection of the reflective layer on the substrate.

It should be understood that the above general description and the following detailed description are exemplary and explanatory only and are not intended to limit the present application.

BRIEF DESCRIPTION OF DRAWINGS

The accompanying drawings, which are incorporated in and constitute a part the description, illustrate embodiments consistent with the present application and, together with the description, serve to explain the principles of the present application. It will be apparent that the drawings described below are only some embodiments of the present application, and other drawings may be obtained from them without creative effort for those of ordinary skill in the art.

DETAILED DESCRIPTION

The exemplary embodiments will now be described more fully with reference to the accompanying drawings. However, the example embodiments can be implemented in a variety of forms and should not be construed as being limited to the examples set forth herein. Rather, these embodiments are provided so that the present application will be more comprehensive and complete, and the concept of exemplary embodiments will be fully communicated to those skilled in the art.

Further, the described features, structures or characteristics may be incorporated in any suitable manner in one or more embodiments. In the following description many specific details are provided to give a full understanding of the embodiments of the present application. However, those skilled in the art will appreciate that the technical aspects of the present application may be practiced without one or more of the specific details, or other methods, components, devices, steps and the like may be employed. In other instances, the common methods, devices, implementations or operations are not shown or described in detail to avoid obscuring aspects of the present application.

The present application is further described below with reference to the accompanying drawings and specific embodiments. It should be noted that the technical features involved in the different embodiments of the present application described below can be combined mutually in case of no conflict. The following embodiments described with reference to the drawings are illustrative and only used to explain the present application, but may not be interpreted as the restrictions of the present application.

Embodiment 1

Referring to FIGS. 1 to 7, embodiment 1 provides a display panel. The display panel is, for example, an OLED (Organic Light Emitting Diode) display panel. For example, the display panel in this embodiment can be applied to electronic devices such as notebook computers, mobile phones, vehicle-mounted display devices, etc.

Figure 1:
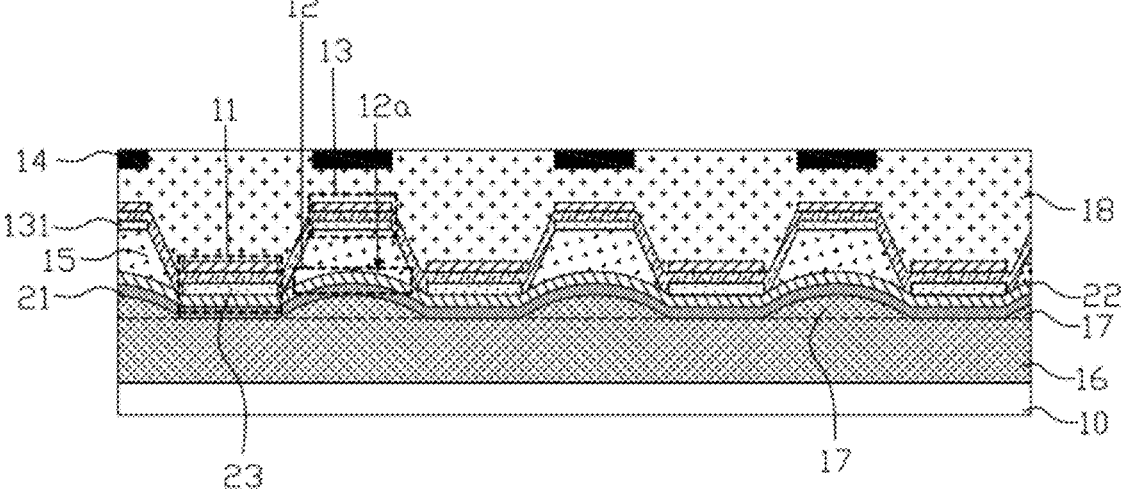
FIG. 1 shows a partial sectional structural diagram of a display panel according to embodiment 1 of the present application.

As shown in FIG. 1, the display panel includes a substrate 10 and a plurality of pixel units arranged in an array on the substrate 10. Each of the pixel units includes a plurality of display light-emitting devices 11. For example, the display light-emitting devices 11 are OLEDs (Organic Light Emitting Diode).

As shown in conjunction with FIG. 1, the display panel further includes an anti-view unit located between adjacent display light-emitting devices 11, and the anti-view unit includes a reflective layer 12, an anti-view light-emitting device 13 and an anti-view light-shielding layer 14 which are sequentially formed on the substrate 10. For example, the anti-view light-emitting device 13 is an OLED (Organic Light Emitting Diode). The anti-view light-shielding layer 14 may be a black matrix (BM), that is, made of a black material, so as to improve the shielding effect of the anti-view light-emitting device 13 in a positive viewing angle, thereby ensuring that a normal display screen is viewed in a positive viewing angle.

Figure 3:
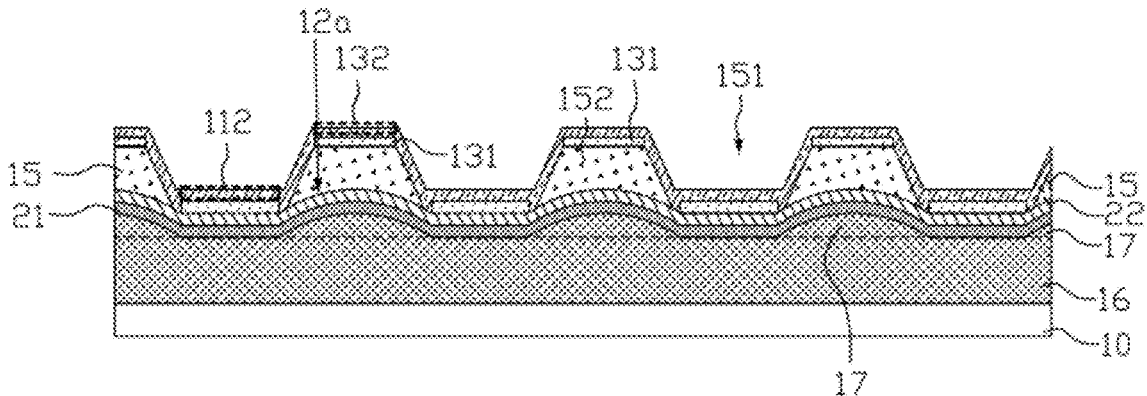
FIG. 3 shows a partial sectional structural diagram of the display panel shown in FIG. 2 according to embodiment 1 of the present application

In some embodiments, as shown in conjunction with FIGS. 1 and 3, the orthographic projection of the light-emitting layer 132 of the anti-view light-emitting device on the substrate 10 is located within the orthographic projection of the anti-view light-shielding layer 14 on the substrate 10, and the orthographic projection of the light-emitting layer 132 of the anti-view light-emitting device on the substrate 10 at least partially overlaps with the orthographic projection of the reflective layer 12 on the substrate 10.

It should be understood that the orthographic projection of the light-emitting layer 132 of the anti-view light-emitting device on the substrate 10 is within the orthographic projection of the anti-view light-shielding layer 14 on the substrate 10. Therefore, when the light-emitting layer 132 of the anti-view light-emitting device emits light, part of the emitted light perpendicular to the substrate 10 is blocked by the anti-view light-shielding layer 14. At this time, the display screen viewed by the user from a viewing angle perpendicular to the substrate 10 is still formed by the light emitted by the display light-emitting device 11, and the light emitted by the anti-view light-emitting device 13 is hardly seen, thereby enabling the user to view a normal display screen from the viewing angle perpendicular to the substrate 10. However, part of the light emitted by the substrate 10 at a large angle is not blocked by the anti-view light-shielding layer 14 at a large viewing angle. At this time, the part of the light can be mixed with the light emitted by the display light-emitting device 11, so that the user can simultaneously watch the light emitted by the display light-emitting device 11 and the light emitted by the anti-view light-emitting device 13 at a large viewing angle, so that the picture viewed by the user at a large viewing angle is different in color, and finally the anti-view display is achieved.

To sum up, when the display panel requires the anti-view display, the anti-view display can be achieved by controlling the light emitting of the anti-view light-emitting device 13 of the anti-view unit and mixing light emitted by the of the anti-view light-emitting device with the light emitted by the adjacent display light-emitting device 11. When the display panel requires normal display (i.e., the anti-view function is not needed), the normal display can be achieved by controlling the anti-view device of the anti-view unit not to emit light.

In addition, as shown in conjunction with FIGS. 1 and 3, the anti-view unit further includes a reflective layer 12, the reflective layer 12 is disposed on the substrate 10 prior to the anti-view light-emitting device 13, and the orthographic projection of the light-emitting layer 132 of the anti-view light-emitting device on the substrate 10 at least partially overlaps with the orthographic projection of the reflective layer 12 on the substrate 10. Therefore, when the display panel requires anti-view display, the reflective layer 12 can reflect at least part of the light emitted from the light-emitting layer 132 of the anti-view light-emitting device toward the side close to the substrate 10 to a gap between two adjacent anti-view light-shielding layers 14 (a light emitting area corresponding to the display light-emitting device 11) for light emitting, so as to enhance the display brightness of the display panel during the anti-view display and further improve the luminance efficiency of the display panel.

In this embodiment, as shown in FIG. 1, either of orthographic projection areas of the anti-view light-shielding layer 14 and the anti-view light-emitting device 13 on the substrate 10 is smaller than an orthographic projection area of the reflective surface 12a on the substrate 10, and either of the orthographic projections of the anti-view light-shielding layer 14 and the anti-view light-emitting device 13 on the substrate 10 is located within an orthographic projection of the reflective surface 12a on the substrate 10.

For example, the reflective surface 12a includes a middle region and an edge region disposed around the middle region. The orthographic projection area of the anti-view light-shielding layer 14 on the substrate 10 is larger than the orthographic projection area of the anti-view light-emitting device 13 on the substrate 10, and the orthographic projection of the anti-view light-emitting device 13 on the substrate 10 is within the orthographic projection of the anti-view light-shielding layer 14 on the substrate 10. The orthographic projection area of the anti-view light-shielding layer 14 on the substrate 10 is equal to the orthographic projection area of the middle region of the reflective surface 12a on the substrate 10, and the orthographic projection of the anti-view light-shielding layer 14 overlaps the orthographic projection of the middle region of the reflective surface 12a on the substrate 10. The orthographic projection of the anti-view light-emitting device 13 on the substrate 10 is located within the orthographic projection of the middle region on the substrate 10.

Of course, in other embodiments, the orthographic projection area of the anti-view light-shielding layer 14 on the substrate 10 may also be exactly equal to the orthographic projection area of the anti-view light-emitting device 13 on the substrate 10, and the orthographic projection of the anti-view light-emitting device 13 on the substrate 10 overlaps the orthographic projection of the anti-view light-shielding layer 14 on the substrate 10. In this case, the orthographic projection areas of the anti-view light-shielding layer 14 and the anti-view light-emitting device 13 on the substrate 10 each are equal to the orthographic projection area of the middle region of the reflective surface 12a on the substrate 10, and both overlap the orthographic projection of the middle region of the reflective surface 12a on the substrate 10.

In some embodiments, as shown in conjunction with FIG. 1, the reflective layer 12 includes a reflective surface 12a facing the anti-view light-emitting device 13, and the reflective surface 12a is a curved surface.

For example, the reflective surface 12a may be a concave, convex, wavy curved surface or the like.

It should be understood that the reflective surface 12a of various curved surfaces such as concave, convex or wavy can achieve the adjustment and optimization of the viewing angle and the microcavity effect, thereby improving the luminance efficiency. That is, the reflective surface 12a of various curved surfaces, such as a concave surface, a convex surface, or a wavy surface, is more favorable for changing the propagation path of light rays received by the reflective surface 12a, so as to reflect part of the light received by the reflective surface 12a to a region corresponding to the display light-emitting device 11 for enhancement of light.

Figure 2:
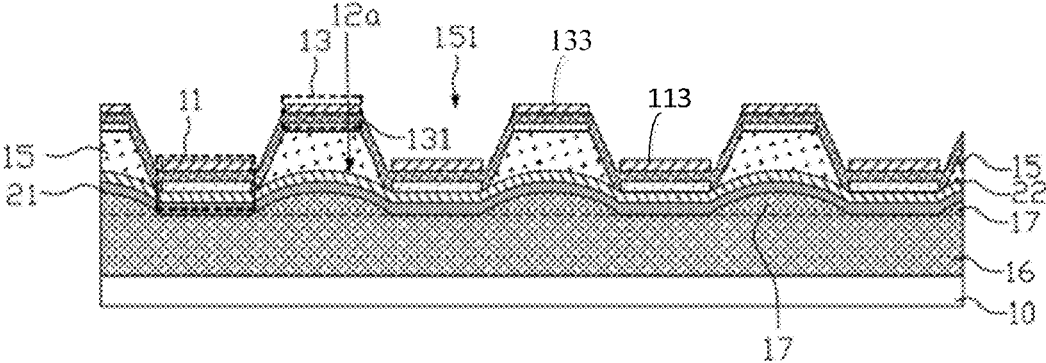
FIG. 2 shows a partial sectional structural diagram of the display panel shown in FIG. 1 according to embodiment 1 of the present application

As shown in conjunction with FIGS. 1 to 3, the display panel further includes a pixel define layer 15 provided on the substrate 10, and the pixel define layer 15 has a plurality of pixel openings 151 arranged at intervals and pixel define parts 152 positioned between adjacent pixel openings 151. The light-emitting layer 112 of each display light-emitting device is correspondingly formed in a pixel opening 151; the anti-view light-emitting device 13 is formed on the surface of the pixel define part 152 away from the substrate 10.

It should be understood that by arranging the anti-view light-emitting device 13 on the side of the pixel define part 152 away from the surface of the substrate 10, it is not necessary to occupy the pixel space of the display panel for designing the display light emitters, but only to utilize the non-pixel space between at least part of the adjacent display light emitters, making the most efficient use of the space of the display panel, facilitating the achievement of high PPI (Pixels Per Inch) product development, and also being able to cope with various pixel pattern architectures.

As shown in connection with 5, the display panel includes a planarization layer 16 (PLN) and a protruding part 17. The planarization layer 16 and the protruding part 17 are formed on the substrate 10 prior to the reflective layer 12 and the display light-emitting device 11. The protruding part 17 is located on the side of the planarization layer 16 away from the substrate 10, the orthographic projection of the protruding part 17 on the substrate 10 is located in the orthographic projection of the pixel define part 152 on the substrate 10, the surface of the protruding part 17 away from the substrate 10 is a convex surface protruding upward, and the reflective layer 12 is formed on the convex surface.

For example, the planarization layer 16 and the protruding part 17 may be an integral structure or split structures.

In this embodiment, the planarization layer 16 and the protruding part 17 are an integral structure, and the planarization layer 16 and the protruding part 17 is formed by exposure using a Half-tone mask.

Forming the planarization layer 16 and the protruding part 17 by exposure using a half-tone mask includes: forming an organic thin film layer covering the substrate 10 on the substrate 10, and the organic thin film layer may be an acrylic material; and forming a photoresist layer covering the organic thin film layer on the substrate 10. The photoresist layer is exposed using the half-tone mask, and then the photoresist layer and the organic thin film layer are sequentially developed according to the amount of exposure, and finally the planarization layer 16 and the protruding part 17 are simultaneously formed.

It should be understood that the half-tone mask includes at least a first light-transmitting region, a second light-transmitting region, and an opaque region, and a light transmittance of the first light-transmitting region is greater than that of the second light-transmitting region. When the photoresist layer is exposed by virtue of the half-tone mask, if the photoresist layer is a positive photoresist layer, the first light-transmitting region corresponds to a region other than the planarization layer 16, the second light-transmitting region corresponds to the planarization layer 16 opposite to the pixel opening 151, and the opaque region corresponds to the protruding part 17. After the photoresist layer is exposed, the photoresist layer corresponding to the first light-transmitting region can be developed first, and the organic thin film layer corresponding to the first light-transmitting region can be etched, and the organic thin film layer corresponding to the second light-transmitting region and the opaque region can be retained; then the photoresist layer corresponding to the second light-transmitting region is developed, the organic thin film layer corresponding to the second light-transmitting region is etched, and the photoresist layer corresponding to the opaque region is retained; and finally, the photoresist layer corresponding to the opaque region is removed to obtain the planarization layer 16 and the protruding part 17 at the same time.

Figure 5:
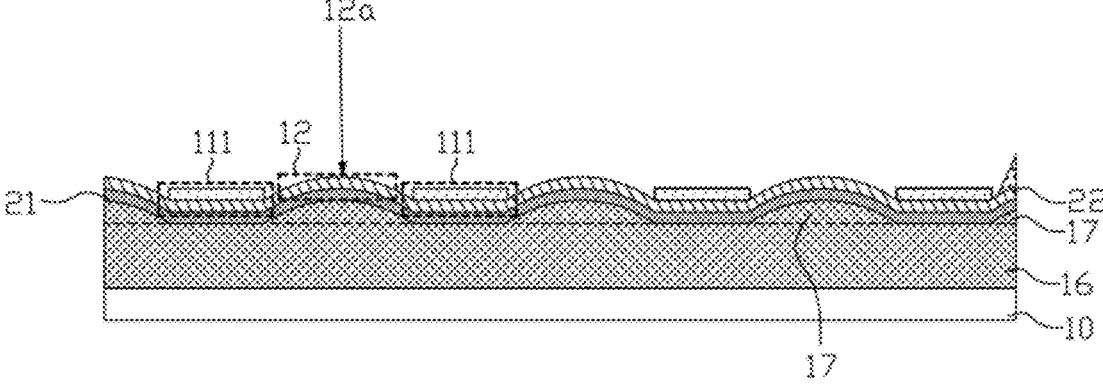
FIG. 5 shows a partial sectional structural diagram of the display panel shown in FIG. 4 according to embodiment 1 of the present application

In some embodiments, as shown in conjunction with FIG. 5, the reflective layer 12 is disposed in the same layer as at least a part of the anode 111 of the display light-emitting device.

For example, when the number of layers of the reflective layer 12 is equal to the number of layers of the anode 111 of the display light-emitting device, the entire reflective layer 12 may be arranged in the same layer as the entire anode 111 of the display light-emitting device. When the number of layers of the reflective layer 12 is smaller than the number of layers of the anode 111 of the display light-emitting device, each layer of the reflective layer 12 may be arranged one-to-one in the same layer corresponding to a part of layers of the anode 111 of the display light-emitting device.

It should be understood that when the reflective layer 12 is provided at the same layer as at least part of the anode 111 of the display light-emitting device, the times of photo process can be reduced, thereby saving the cost.

Figure 4:
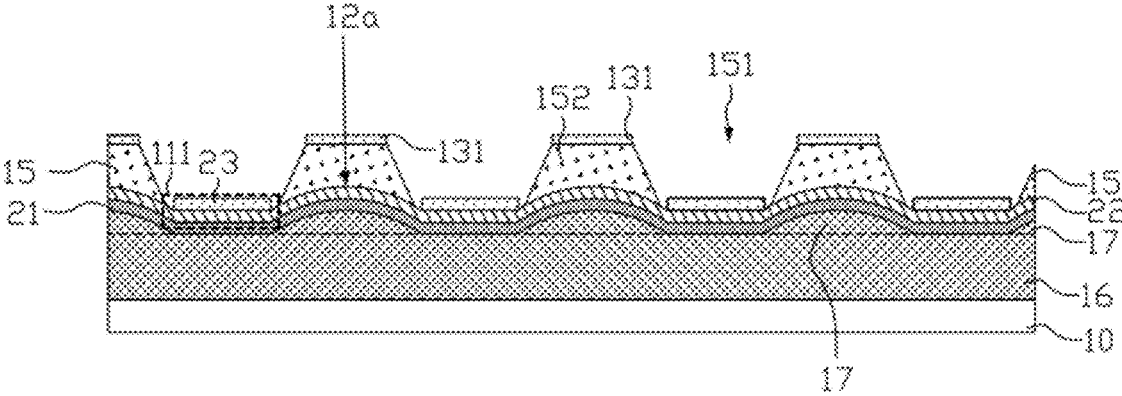
FIG. 4 shows a partial sectional structural diagram of the display panel shown in FIG. 3 according to embodiment 1 of the present application

In this embodiment, as shown in conjunction with FIGS. 4 and 5, the anode 111 of the display light-emitting device includes a first transparent electrode layer 21, a metal electrode layer 22 and a second transparent electrode layer 23, which are stacked in sequence. The first transparent electrode layer 21 and the metal electrode layer 22 are formed on the substrate 10 prior to the pixel define layer 15. The second transparent electrode layer 23 is formed on the metal electrode layer 22 after the pixel define layer 15 is formed on the substrate.

For example, the first transparent electrode layer 21 and the second transparent electrode layer 23 are high work function material layers, which may include indium tin oxide (ITO), indium zinc oxide (IZO), zinc oxide (ZnO) or indium oxide ($In_2O_3$). The metal electrode layer 22 may include silver (Ag), that is, the anode 111 of the display light-emitting device is a multilayer structure of ITO/Ag/ITO. Of course, in other embodiments, the anode 111 of the display light-emitting device may include only the first transparent electrode layer 21 and the metal electrode layer 22, in which case, the anode 111 of the display light-emitting device is a multilayer structure of ITO/Ag.

In this embodiment, as shown in FIGS. 4 and 5, the reflective layer 12 is a composite structure provided in the same layer as the first transparent electrode layer 21 and the metal electrode layer 22. The anode 131 of the anti-view light-emitting device is arranged in the same layer as the second transparent electrode layer 23 and is disconnected from each other.

The reflective layer 12 is a multi-layer structure of ITO/Ag; and the anode 131 of the anti-view light-emitting device is composed of only one layer of ITO. Therefore, when the reflective layer 12 is formed, the ITO layer of the reflective layer 12 and the ITO layer of the anode 111 of the display light-emitting device may be formed by one patterning process. The Ag layer of the reflective layer 12 and the Ag layer of the anode 111 of the display light-emitting device may be formed by one patterning process. The anode 131 of the anti-view light-emitting device and the ITO layer of the anode 111 of the display light-emitting device may be formed by one patterning process.

With reference to FIGS. 1 to 5, it should be understood that the ITO layer of each of the anode 131 of the anti-view light-emitting device and the anode 111 of the display light-emitting device is disposed following the pixel define layer 15. That is to say, according to the display panel in this embodiment, a continuous multilayer structure of ITO/Ag is firstly formed on a side of the protruding part 17 away from the substrate 10 and on a side of the partial planarization layer 16 (the partial planarization layer 16 corresponding to the pixel opening 151) away from the substrate 10.

Then, an organic thin film layer covering the entire multilayer structure of ITO/Ag is formed on the substrate 10, and the organic thin film layer is exposed, developed, and etched to obtain the pixel define layer 15. As shown in conjunction with FIG. 4 and FIG. 5, a part of the multilayer structure of ITO/Ag exposed from the pixel opening 151 of the pixel define layer 15 is a part of the anode 111 for the display light-emitting device, and part of the multilayer structure of ITO/Ag covered by the pixel define part 152 of the pixel define layer 15 is the reflective layer 12.

Then, a layer of ITO is formed on the pixel define layer 15 such that a part of ITO exposed from the pixel opening 151 of the pixel define layer 15 is a part of the anode 111 of the display light-emitting device, and the ITO located on the side of the pixel defining part 152 of the pixel define layer 15 away from the substrate 10 is the anode 131 of the anti-view light-emitting device, the anode 131 of the anti-view light-emitting device is disconnected from the anode 111 of the display light-emitting device.

Next, a light-emitting layer 132 of the anti-view light-emitting device and a cathode 133 of the anti-view light-emitting device, and a light-emitting layer 112 of the display light-emitting device and a cathode 113 of the display light-emitting device are formed sequentially. When the light-emitting layer 132 of the anti-view light-emitting device and the light-emitting layer 112 of the display light-emitting device emit a same color of light, the light-emitting layer 132 of the anti-view light-emitting device and the light-emitting layer 112 of the display light-emitting device may be continuous or disconnected. The cathode 133 of the anti-view light-emitting device 13 and the cathode 113 of the display light-emitting device 11 may be continuous or may be disconnected.

Further, an organic leveling layer 18 is formed over the light-emitting layer 132 of the anti-view light-emitting device, the cathode 133 of the anti-view light-emitting device, the light-emitting layer 112 of the display light-emitting device, and the cathode 113 of the display light-emitting device. The anti-view light-shielding layer is provided at the side of the organic leveling layer 18 away from the substrate 10. In this embodiment, the surface on the side of the anti-view light-shielding layer away from the substrate 10 is on the same level as the surface on the side of the organic leveling layer 18 away from the substrate 10. Of course, in other embodiments, the anti-view shielding layer may be provided to protrude from the organic leveling layer 18. There are no restrictions here.

Of course, in other embodiments, the reflective layer 12 is a composite structure provided in the same layer as the first transparent electrode layer 21, the metal electrode layer 22 and the second transparent electrode layer 23. The anode 131 of the anti-view light-emitting device is formed by a separate film process. That is, the reflective layer 12 has a multi-layer structure formed by ITO/Ag/ITO. Therefore, when the reflective layer 12 is formed, two ITO layers of the reflective layer 12 and two ITO layers of the anode 111 for the display light-emitting device can be formed by two patterning processes respectively. The Ag layer of the reflective layer 12 and the Ag layer of the anode 111 of the display light-emitting device may be formed by one patterning process. The anode 131 of the anti-view light-emitting device and the ITO layer of the anode 111 of the display light-emitting device may be formed by one patterning process.

It should be understood that in the present application, "arranged in the same layer" refers to a layer structure in which a layer for forming a specific pattern is formed by the same film forming process and then formed by one patterning process using the same mask. That is, one patterning process corresponds to a mask (also known as photomask). Depending on the specific graphics, one patterning process may include multiple exposure, development or etching processes, and the specific patterns in the formed layer structure may be continuous or discontinuous, and these specific patterns may also be at different heights or have different thicknesses, thus simplifying the manufacturing process, saving manufacturing costs and improving production efficiency.

In this embodiment, the display panel includes a display area and a non-display area arranged around the display area. The non-display area has a left boundary and a right boundary located on opposite sides of the display area in a row direction, and an upper boundary and a lower boundary located on opposite sides of the display area in a column direction. The lower boundary is bound with a driving chip, which is connected with the display light-emitting device 11. Specifically, the connection between the driving chip and the display light-emitting device 11 can be achieved by a structure such as a driving circuit layer arranged on the substrate 10.

Since it is necessary to control each anti-view light-emitting device 13 separately, as the resolution is getting higher and higher, there are more lines. If all of them are pulled to the lower boundary and connected to the driving chip, resulting in more lines on the lower boundary side, space is limited, and the driver chip needs to support the increase of pins (Pin) unit, even if it can be achieved also expensive.

At least one of the left boundary, the right boundary and the upper boundary is provided with an adapter circuit board, and the anode 131 of the anti-view light-emitting device is connected with the adapter circuit board through traces, and the adapter circuit board is plugged with the driving chip. By providing the adapter circuit board at other boundaries except the lower boundary to connect the anode 131 of the anti-view light-emitting device and the driving chip, the lower boundary space can be saved and the design cost can be saved.

The adapter circuit board can be FPC (flexible circuit board), one side of which can be connected with the anode 131 of the anti-view light-emitting device through wiring binding, and the other side can be bent to the back of the substrate 10 and then connected to the driving chip. For example, the adapter circuit board is connected to the driving chip in an interface plug-in mode.

For example, in the display device, only one adapter circuit board may be arranged, which may be arranged at the right boundary, but not limited thereto, and may also be arranged at the left boundary and the upper boundary. The anodes 131 of the anti-view light-emitting devices are separately wired, and after being connected in parallel to the same trace, they are connected to the driving chip via the adapter circuit board, so that the anti-view light-emitting devices 13 are separately driven relative to the display light-emitting device 11, which is not limited thereto. A plurality of adapter circuit boards may be provided, and the plurality of adapter circuit boards are connected in parallel to one line and then inserted into the driving chip.

There are various wiring modes between the anodes 131 of the anti-view light-emitting devices, such as horizontal/vertical or oblique wiring, or cross wiring mode, or a wiring variant based on the same.

Figure 6:
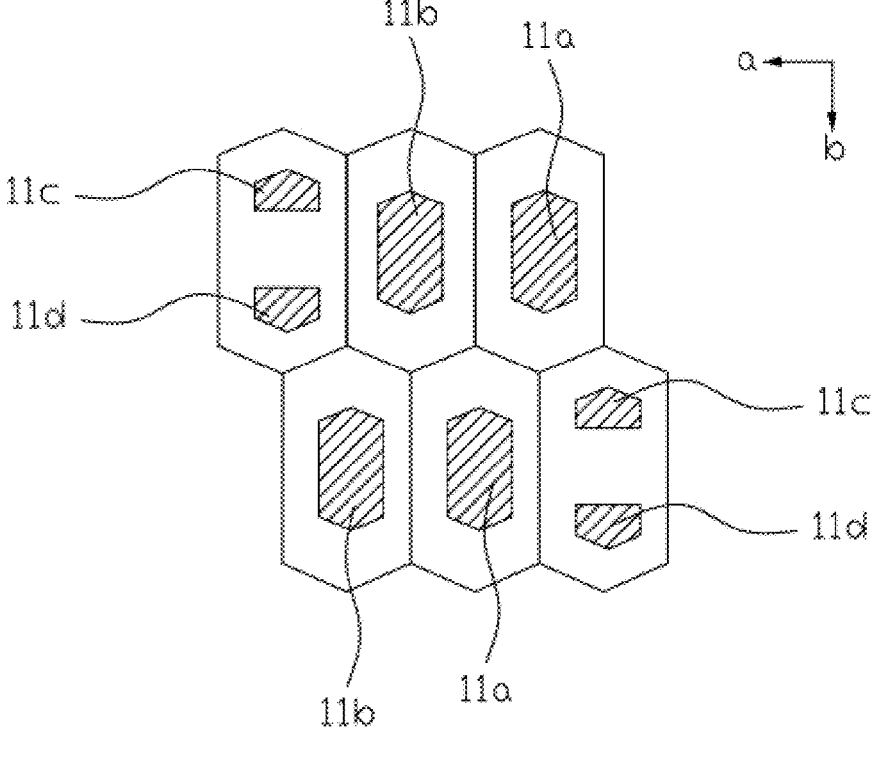
FIG. 6 shows a partial planar structural diagram of the display panel according to embodiment 1 of the present application.
Figure 7:
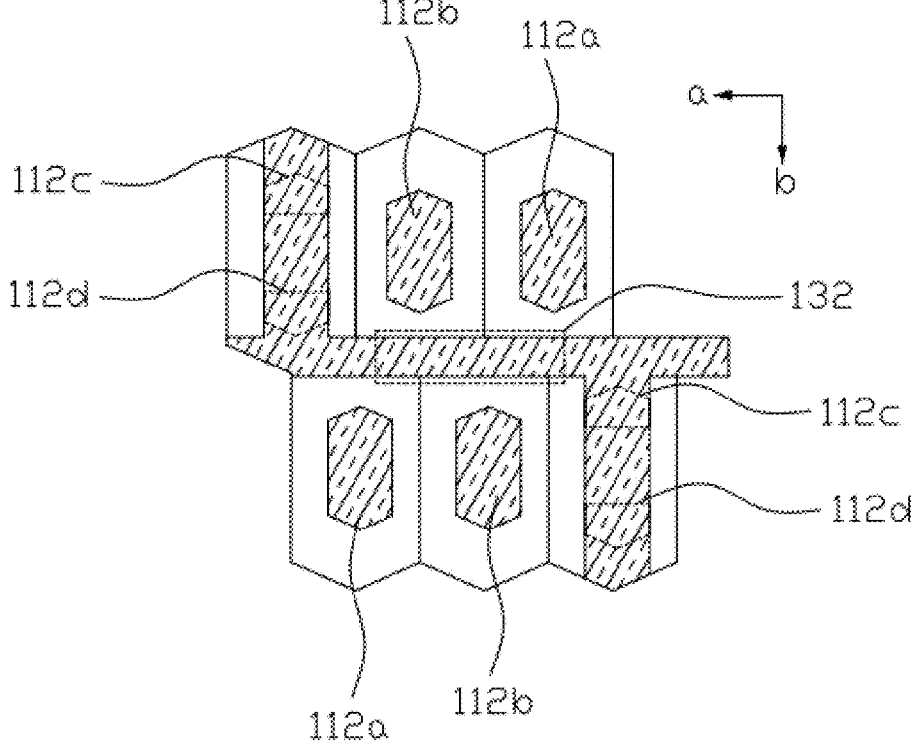
FIG. 7 is a planar structural diagram where a light-emitting layer of a display light-emitting device is connected with a light-emitting layer of an anti-view light-emitting device of the display panel according to embodiment 1 of the present application.

In some embodiments, as shown in conjunction with FIGS. 6 to 7, in a pixel unit: a plurality of display light-emitting devices 11 include first to fourth display light-emitting devices, the third display light-emitting device 11c and the fourth display light-emitting device 11d emit the same color of light, and the third display light-emitting device 11c, the first display light-emitting device 11a and the second display light-emitting device 11b all emit different colors of light. The first display light-emitting device 11a and the second display light-emitting device 11b are arranged in a first direction a. The third display light-emitting devices 11c and the fourth display light-emitting devices 11d are both arranged along a second direction b intersecting the first direction a, and the third display light-emitting devices 11c and the fourth display light-emitting devices 11d are both located at a side of the first display light-emitting device 11a away from the second display light-emitting device 11b along the first direction a. An anti-view light-emitting device 13 is provided on one side of the first display light-emitting device 11a or the second display light-emitting device 11b along the second direction b.

For example, the first direction a is perpendicular to second direction b.

It should be understood that since the third display light-emitting device 11c and the fourth display light-emitting device 11d are both arranged along the second direction b intersecting with the first direction a on the side of the first display light-emitting device 11a away from the second display light-emitting device 11b, when the anti-view light-emitting device 13 is disposed on the side of the first display light-emitting device 11a along the second direction b. If the light-emitting layer 132 of the anti-view light-emitting device emits the same color of light as the light-emitting layer 112c of the third display light-emitting device and the light-emitting layer 112d of the fourth display light-emitting device, the light-emitting layer 132 of the anti-view light-emitting device can be integrated with the light-emitting layer 112c of the third display light-emitting device and the light-emitting layer 112d of the fourth display light-emitting device, which is convenient to fabricate the light-emitting layer 132 of the anti-view light-emitting device in the same layer as the light-emitting layer 112c of the third display light-emitting device and the light-emitting layer 112d of the fourth display light-emitting device.

In this embodiment, as shown in conjunction with FIGS. 6 to 7, the display panel includes a plurality of anti-view units, each of which is arranged corresponding to one pixel unit. The first display light-emitting device 11a, the second display light-emitting device 11b and the anti-view light-emitting device 13 emit different colors of light. The light-emitting layers 132 of the third display light-emitting device

11c, the fourth display light-emitting device 11d and the anti-view light-emitting device emit a same color of light, and the color of light is green.

For example, the color of the light emitted by the light-emitting layer 112a of the first display light-emitting device is one of blue and red, and the color of the light emitted by of the light-emitting layer 112b of the second display light-emitting device is the other of blue and red.

It should be understood that when the light-emitting layer 132 of the anti-view light-emitting device is green, when the anti-view function of the display panel is enabled, the whole of the display panel is green in a large viewing angle, thereby causing the user to watch the display screen of the display panel with different colors in a large viewing angle, interfering with information reading, so as to achieve anti-view.

In the embodiments of the present application, the display panel includes an anti-view unit, which is arranged between adjacent display light-emitting devices. Therefore, when the display panel requires the anti-view display, the anti-view display can be achieved only by controlling the light emitting of the anti-view light-emitting device of the anti-view unit and mixing light emitted by the of the anti-view light-emitting device with the light emitted by the adjacent display light-emitting device; when the display panel requires normal display (i.e., the anti-view function is not needed), the normal display can be achieved only by controlling the anti-view device of the anti-view unit not to emit light.

In addition, the anti-view unit also comprises a reflective layer, which is arranged on the substrate prior to the anti-view light-emitting device, and the orthographic projection of the light-emitting layer of the anti-view light-emitting device on the substrate overlaps at least partially with the orthographic projection of the reflective layer on the substrate. Therefore, when the display panel requires anti-view display, the reflective layer can reflect at least part of the light emitted from the light-emitting layer of the anti-view light-emitting device toward the side close to the substrate to a gap between two adjacent anti-view light-shielding layers (the light emitting area corresponding to the display light-emitting device) for light emitting, so as to enhance the display brightness of the display panel during the anti-view display and further improve the luminance efficiency of the display panel.

Embodiment 2

Figure 8:
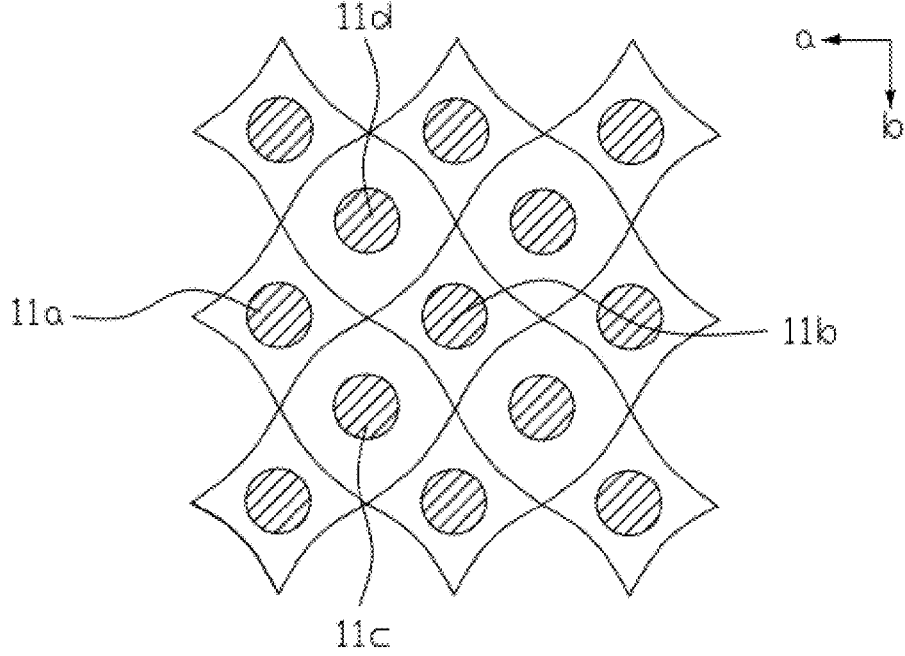
FIG. 8 shows a partial planar structural diagram of the display panel according to embodiment 2 of the present application.
Figure 9:
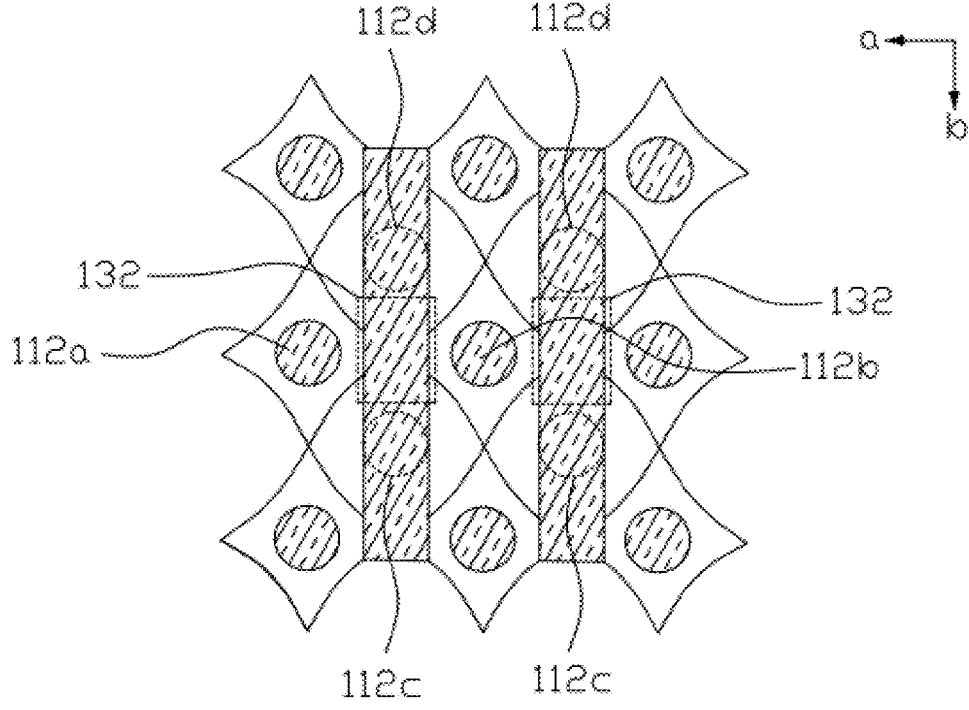
FIG. 9 is a planar structural diagram where the light-emitting layer of the display light-emitting device is connected with a light-emitting layer of the anti-view light-emitting device according to embodiment 2 of the present application.

As shown in FIG. 8 and FIG. 9, the display panel in the second embodiment is approximately the same as the display panel in embodiment 1, except that the arrangement of the display light-emitting devices in the pixel unit of the display panel in embodiment 2 is different, and the arrangement positions of the anti-view light-emitting devices of the anti-view unit and the display light-emitting devices are different.

As shown in conjunction with FIGS. 8 and 9, in a pixel unit, a plurality of display light-emitting devices 11 include first to fourth display light-emitting devices, the third display light-emitting device 11c and the fourth display light-emitting device 11d emit the same color of light, and the third display light-emitting device 11c, the first display light-emitting device 11a, and the second display light-emitting device 11b emit different colors of light. The first display light-emitting device 11a, the second display light-emitting device 11b, the third display light-emitting device 11c and the fourth display light-emitting device 11d are arranged around the anti-view light-emitting device 13, and the third display light-emitting device 11c, the fourth display light-emitting device 11d and the anti-view light-emitting device 13 are arranged in a same direction.

For example, the first direction a is perpendicular to the second direction b.

It should be understood that since the third display light-emitting device 11c, the fourth display light-emitting device 11d and the anti-view light-emitting device 13 are arranged in the same direction, and the first display light-emitting device 11a, the second display light-emitting device 11b, the third display light-emitting device 11c and the fourth display light-emitting device 11d are respectively disposed around the anti-view light-emitting device 13. Therefore, if the light-emitting layer 132 of the anti-view light-emitting device emits the same color of light as the light-emitting layer 112c of the third display light-emitting device and the light-emitting layer 112d of the fourth display light-emitting device, the light-emitting layer 132 of the anti-view light-emitting device can be integrated with the third display light-emitting device 11c and the light-emitting layer 112d of the fourth display light-emitting device, which is convenient to fabricate the light-emitting layer 132 of the anti-view light-emitting device in the same layer as the light-emitting layer 112c of the third display light-emitting device and the light-emitting layer 112d of the fourth display light-emitting device.

In this embodiment, as shown in conjunction with FIGS. 8 and 9, the first display light-emitting device 11a, the second display light-emitting device 11b and the anti-view light-emitting device 13 emit different colors of light. The third display light-emitting device 11c, the fourth display light-emitting device 11d and the anti-view light-emitting device 13 emit a same color of light, and the color of light is green.

For example, the color of the light emitted by the light-emitting layer 112a of the first display light-emitting device is one of blue and red, and the color of the light emitted by of the light-emitting layer 112b of the second display light-emitting device is the other of blue and red.

It should be understood that when the light-emitting layer 132 of the anti-view light-emitting device is green, when the anti-view function of the display panel is enabled, the whole of the display panel is green in a large viewing angle, thereby causing the user to watch the display screen of the display panel with different colors in a large viewing angle, interfering with information reading, so as to achieve anti-view.

Of course, in other embodiments, the colors of light emitted by the third display light-emitting device 11c, the fourth display light-emitting device 11d and the anti-view light-emitting device 13 may all be red or blue, in which case the color of light emitted by the light-emitting layer 112a of the first display light-emitting device is one of green and red, and the color of light emitted by the light-emitting layer 112b of the second display light-emitting device is the other of green and red.

For other configurations and operating principles of the display panel, please refer to embodiment 1, which will not be described here.

In the present application, unless otherwise explicitly provided and limited, the terms such as "mount," "connect," should be understood broadly, which, for example, may refer to a fixed connection, a detachable connection, or an integral connection; which may refer to a mechanical connection or an electrical connection; which may refer to a direct connection or an indirect connection via an intermediate medium; which may also refer to a communication between the insides of two elements. For those ordinarily skilled in the art, the specific meanings of the above terms in the present application will be understood according to the specific circumstances.

In addition, the terms of "first", "second" are for descriptive purposes only and cannot be construed as indicating or implying relative importance or implying the number of the indicated technical features. Thus, features defined with "first" and "second" may explicitly or implicitly include one or more of the features. Unless otherwise expressly specified, "multiple" means two or more. The terms "some embodiments," "example," etc. mean that specific features, structures, materials, or characteristics described in connection with the embodiment or example are encompassed in at least one embodiment or example of the present application.

The schematic formulation of the above terms need not be directed to the same embodiments or examples. Further, the specific features, structures, materials or characteristics described may be combined in a suitable manner in any one or more embodiments or examples. Further, without contradicting one another, those skilled in the art may combine and incorporate different embodiments or examples described in the description and features of different embodiments or examples.

Although embodiments of the present application have been shown and described above, it will be understood that the above-mentioned embodiments are exemplary and cannot be construed as limiting the present application. Those of ordinary skill in the art may make changes, variations, alternatives and modifications to the above-mentioned embodiments within the scope of the present application. Therefore, any changes or modifications made in accordance with the claims and descriptions of the present application should fall within the scope of the patent of the present application.

What is claimed is:

1. A display panel, comprising:
a substrate;
a plurality of pixel units arranged in an array on the substrate, each of the plurality of pixel units comprising a plurality of display light-emitting devices; and
an anti-view unit positioned between adjacent display light-emitting devices, and the anti-view unit comprising a reflective layer, an anti-view light-emitting device and an anti-view light-shielding layer sequentially formed on the substrate;
wherein an orthographic projection of a light-emitting layer of the anti-view light-emitting device on the substrate is located within an orthographic projection of the anti-view light-shielding layer on the substrate, and the orthographic projection of the light-emitting layer of the anti-view light-emitting device on the substrate overlaps at least partially with an orthographic projection of the reflective layer on the substrate;
wherein the reflective layer comprises a reflective surface facing the anti-view light-emitting device, and the reflective surface is a curved surface;
wherein either of orthographic projection areas of the anti-view light-shielding layer and the anti-view light-emitting device on the substrate is smaller than an orthographic projection area of the reflective surface on the substrate, and either of the orthographic projection of the anti-view light-shielding layer or the orthographic projection of the anti-view light-emitting device on the substrate is located within the orthographic projection of the reflective surface on the substrate.

2. The display panel according to claim 1, wherein an orthographic projection area of the anti-view light-shielding layer on the substrate is larger than an orthographic projection area of the anti-view light-emitting device on the substrate.

3. The display panel according to claim 1, wherein the orthographic projection of the anti-view light-shielding layer on the substrate overlaps the orthographic projection of the anti-view light-emitting device on the substrate.

4. The display panel according to claim 1, wherein the display panel further comprises a pixel define layer provided on the substrate, the pixel define layer having a plurality of pixel openings arranged at intervals and pixel define parts positioned between adjacent pixel openings;

wherein a light-emitting layer of each of the plurality of display light-emitting devices is correspondingly formed in one of the plurality of pixel openings; and wherein the anti-view light-emitting device is formed on a surface of the pixel define parts away from the substrate.

5. The display panel according to claim 4, further comprising:

a planarization layer; and a protruding part located on a side of the planarization layer away from the substrate, an orthographic projection of the protruding part on the substrate is located in an orthographic projection of the pixel define part on the substrate, a surface of the protruding part away from the substrate is a convex surface protruding upward, and the reflective layer is formed on the convex surface;

wherein the planarization layer and the protruding part are formed on the substrate prior to the reflective layer and the plurality of display light-emitting devices.

6. The display panel according to claim 5, wherein the reflective layer is disposed in a same layer as at least part of an anode of the plurality of display light-emitting devices.

7. The display panel according to claim 6, wherein the anode of the plurality of display light-emitting devices comprises a first transparent electrode layer, a metal electrode layer and a second transparent electrode layer stacked in sequence, wherein the first transparent electrode layer and the metal electrode layer are formed on the substrate prior to the pixel define layer, and the second transparent electrode layer is formed on the metal electrode layer following the pixel define layer;

wherein the reflective layer is a composite structure arranged in a same layer as the first transparent electrode layer and the metal electrode layer; and wherein an anode of the anti-view light-emitting device and the second transparent electrode layer are in a same layer and are disconnected from each other.

8. The display panel according to claim 7, wherein the first transparent electrode layer and the second transparent electrode layer are high work function material layers, which comprises indium tin oxide, indium zinc oxide, zinc oxide or indium oxide.

9. The display panel according to claim 5, wherein the planarization layer and the protruding part are an integral structure or split structures.

10. The display panel according to claim 5, wherein the planarization layer and the protruding part are an integral structure formed by exposure using a Half-tone mask.

11. The display panel according to claim 1, wherein in each of the plurality of pixel units: the plurality of display light-emitting devices comprise a first display light-emitting device, a second display light-emitting device, a third display light-emitting device and a fourth display light-emitting device, the third display light-emitting device and the fourth display light-emitting device emit a same color of light, and the third display light-emitting device, the first display light-emitting device and the second display light-emitting device emit different colors of light;

wherein the first display light-emitting device and the second display light-emitting device are arranged in a first direction;

wherein the third display light-emitting device and the fourth display light-emitting device are arranged along a second direction intersecting with the first direction, and the third display light-emitting device and the fourth display light-emitting device are located at a side of the first display light-emitting device away from the second display light-emitting device along the first direction; and wherein the anti-view light-emitting device is arranged on a side of the first display light-emitting device or the second display light-emitting device along the second direction.

12. The display panel according to claim 1, wherein in each of the plurality of pixel units: the plurality of display light-emitting devices comprise a first display light-emitting device, a second display light-emitting device, a third display light-emitting device and a fourth display light-emitting device, the third display light-emitting device and the fourth display light-emitting device emit a same color of light, and the third display light-emitting device, the first display light-emitting device and the second display light-emitting device emit different colors of light;

wherein the first display light-emitting device, the second display light-emitting device, the third display light-emitting device and the fourth display light-emitting device are arranged around the anti-view light-emitting device, and the third display light-emitting device, the fourth display light-emitting device and the anti-view light-emitting device are arranged in a same direction.

13. The display panel according to claim 11, wherein the first display light-emitting device, the second display light-emitting device and the anti-view light-emitting device emit different colors of light; and wherein the third display light-emitting device, the fourth display light-emitting device and the anti-view light-emitting device emit a same color of light, and the same color of light is green.

14. The display panel according to claim 12, wherein the first display light-emitting device, the second display light-emitting device and the anti-view light-emitting device emit different colors of light; and wherein the third display light-emitting device, the fourth display light-emitting device and the anti-view light-emitting device emit a same color of light, and the same color of light is green.

15. The display panel according to claim 1, wherein the anti-view light-shielding layer is a black matrix.

16. The display panel according to claim 1, wherein an organic leveling layer is formed over the light-emitting layer of the anti-view light-emitting device, a cathode of the anti-view light-emitting device, a light-emitting layer of the plurality of display light-emitting devices, and a cathode of the plurality of display light-emitting devices.

17. The display panel according to claim 16, wherein the anti-view light-shielding layer is provided at a side of the organic leveling layer away from the substrate.

18. The display panel according to claim 17, wherein a surface on a side of the anti-view light-shielding layer away from the substrate is on a same level as a surface on the side of the organic leveling layer away from the substrate.

\* \* \* \* \*